(12) United States Patent
Meyer et al.

(10) Patent No.: US 7,772,652 B2
(45) Date of Patent: Aug. 10, 2010

(54) SEMICONDUCTOR COMPONENT ARRANGEMENT HAVING A FIRST AND SECOND REGION

(75) Inventors: Thorsten Meyer, München (DE); Ralph Stübner, Brussels (BE)

(73) Assignee: Infineon Technologies AG, Neubiberg (DE)

( * ) Notice: Subject to any disclaimer, the term of this patent is extended or adjusted under 35 U.S.C. 154(b) by 116 days.

(21) Appl. No.: 11/550,207

(22) Filed: Oct. 17, 2006

(65) Prior Publication Data

US 2007/0120150 A1 May 31, 2007

(30) Foreign Application Priority Data

Oct. 17, 2005 (DE) .................. 10 2005 049 593

(51) Int. Cl.
*H01L 23/62* (2006.01)
(52) U.S. Cl. ................. 257/368; 257/E21.598
(58) Field of Classification Search ........ 257/288, 257/335, 341, 342, 347–354, 401, 607, 612, 257/368, E21.568
See application file for complete search history.

(56) References Cited

U.S. PATENT DOCUMENTS

| 4,566,174 | A | | 1/1986 | Yasuda et al. |
| 4,862,233 | A | | 8/1989 | Matsushita et al. |
| 5,293,050 | A | | 3/1994 | Chapple-Sokol et al. |
| 5,629,543 | A | * | 5/1997 | Hshieh et al. ............... 257/330 |
| 6,078,090 | A | | 6/2000 | Williams et al. |
| 7,074,663 | B2 | | 7/2006 | Iwabuchi |
| 7,084,457 | B2 | * | 8/2006 | Hsieh et al. ................. 257/329 |
| 2005/0275025 | A1 | * | 12/2005 | Lanzerstorfer ............... 257/350 |

* cited by examiner

*Primary Examiner*—Kimberly D Nguyen
*Assistant Examiner*—Amar Movva
(74) *Attorney, Agent, or Firm*—Dicke, Billig & Czaja, PLLC

(57) ABSTRACT

A semiconductor component arrangement is disclosed. In one embodiment, the semiconductor component arrangement includes a power transistor formed within a semiconductor layer in at least one first region and further semiconductor components formed at least in a second region, an effective thickness of the semiconductor layer being smaller in the first region than in the second region.

9 Claims, 13 Drawing Sheets

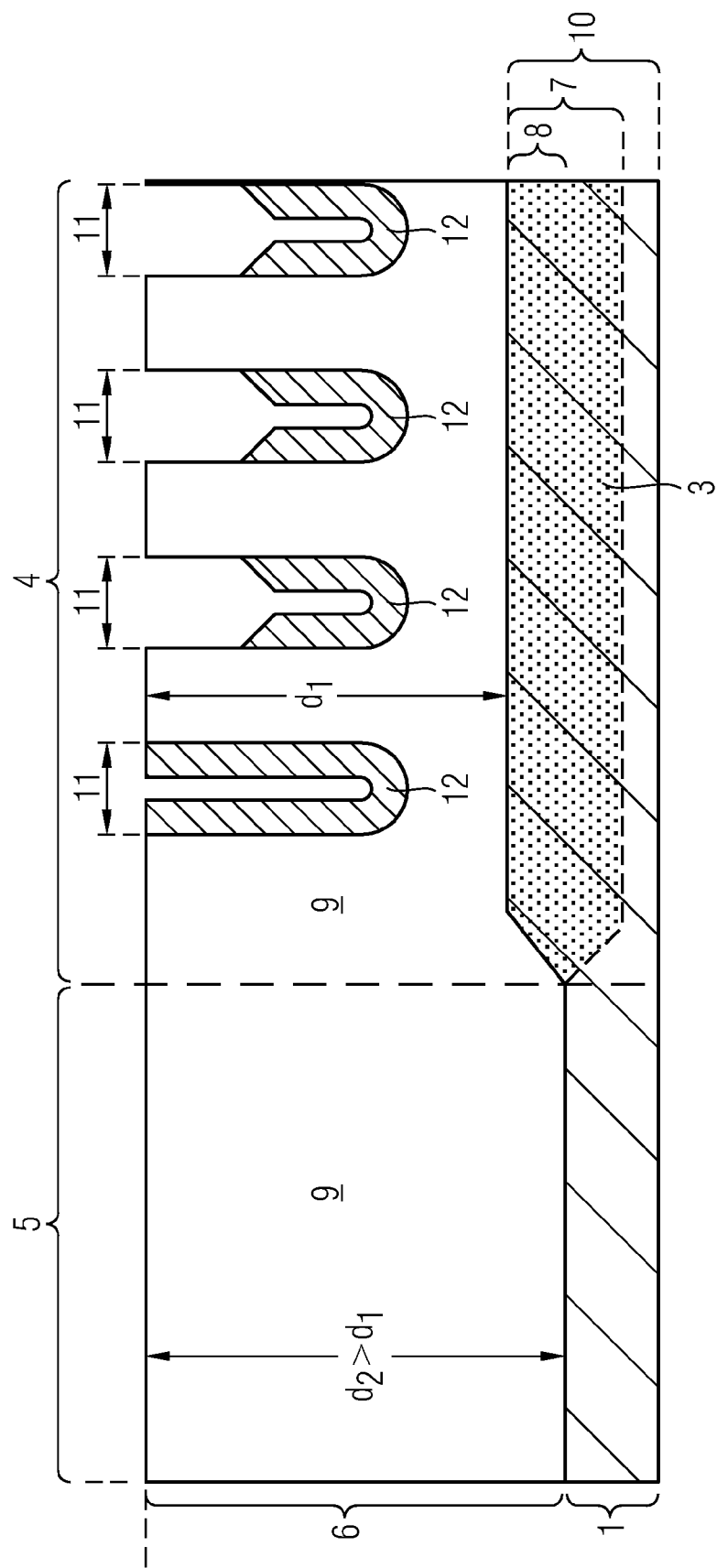

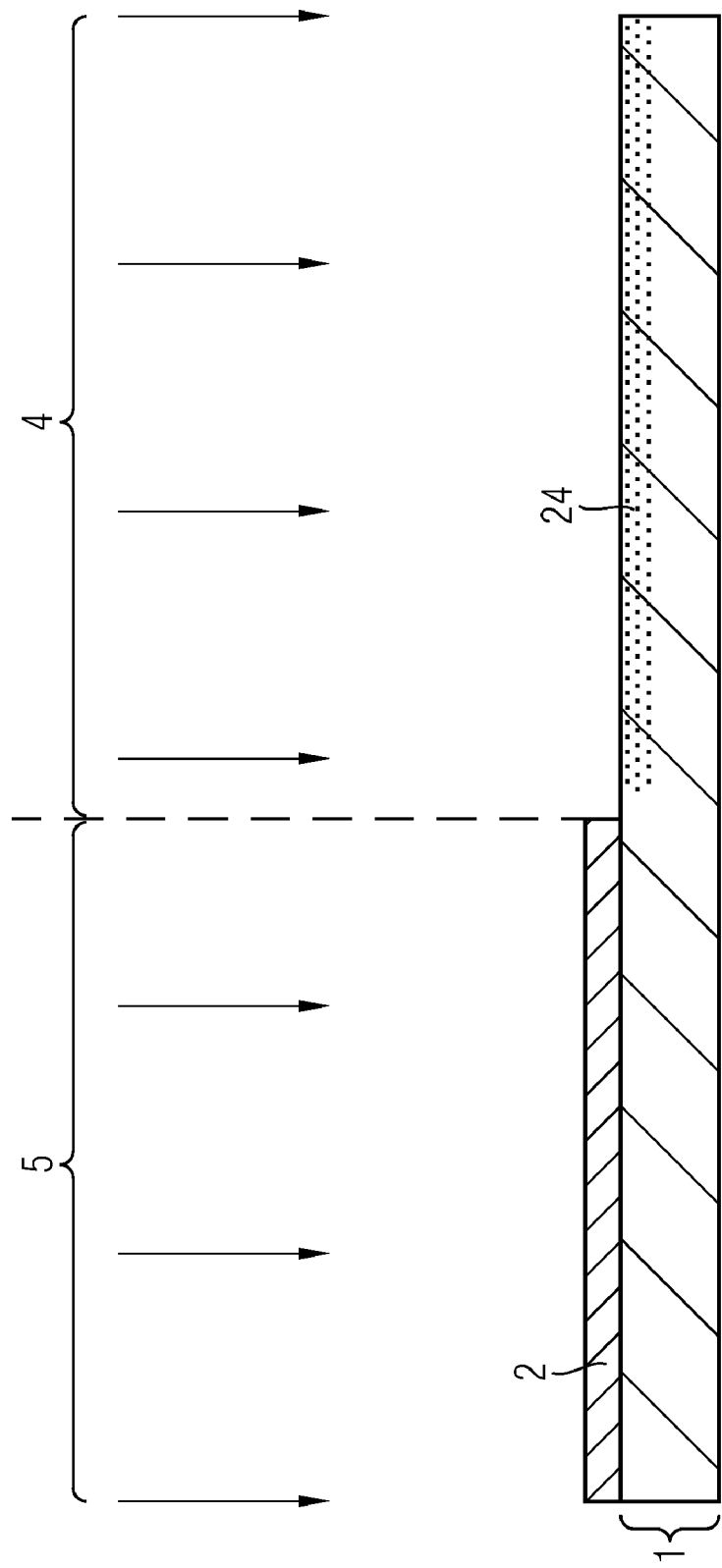

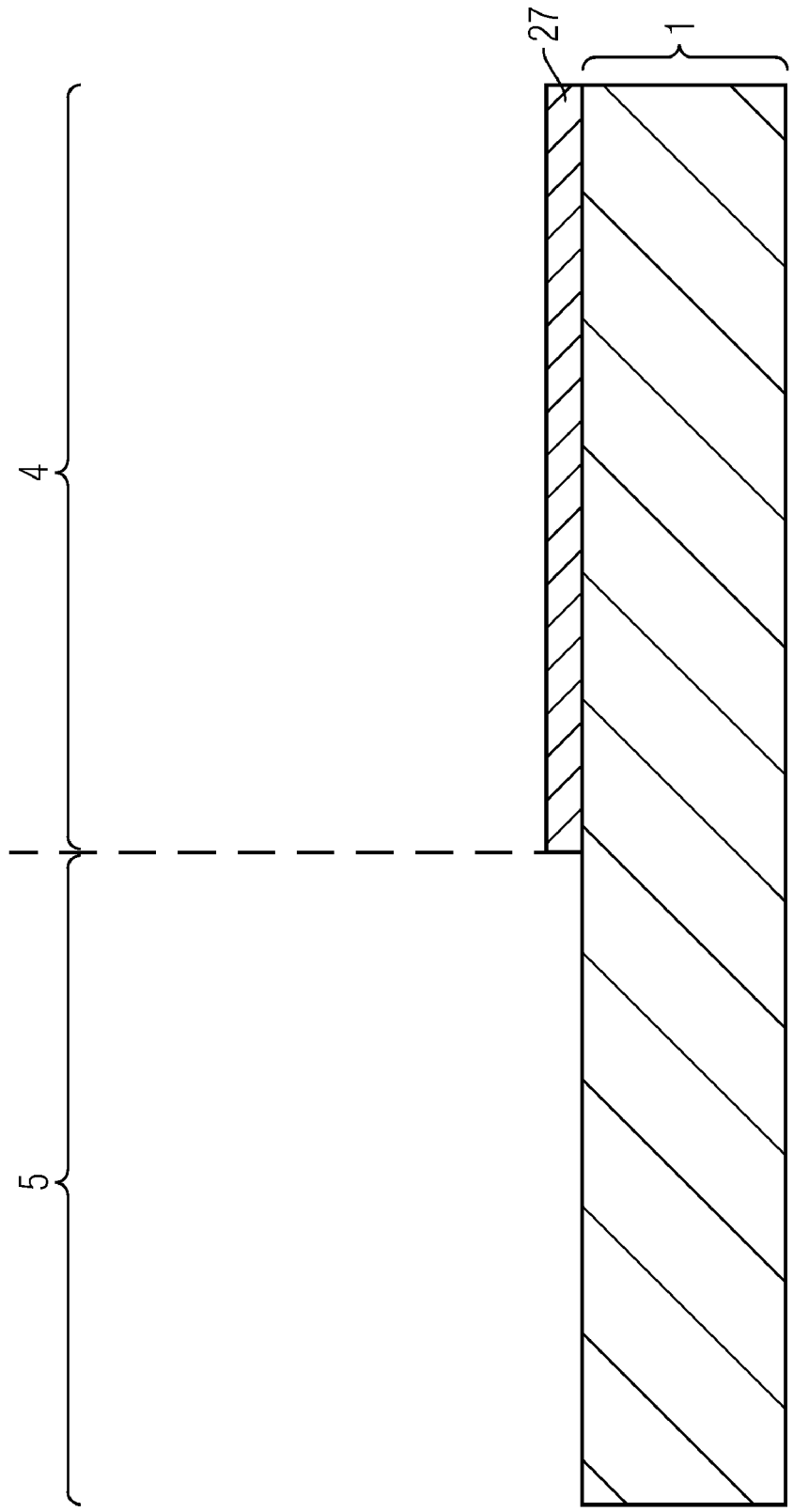

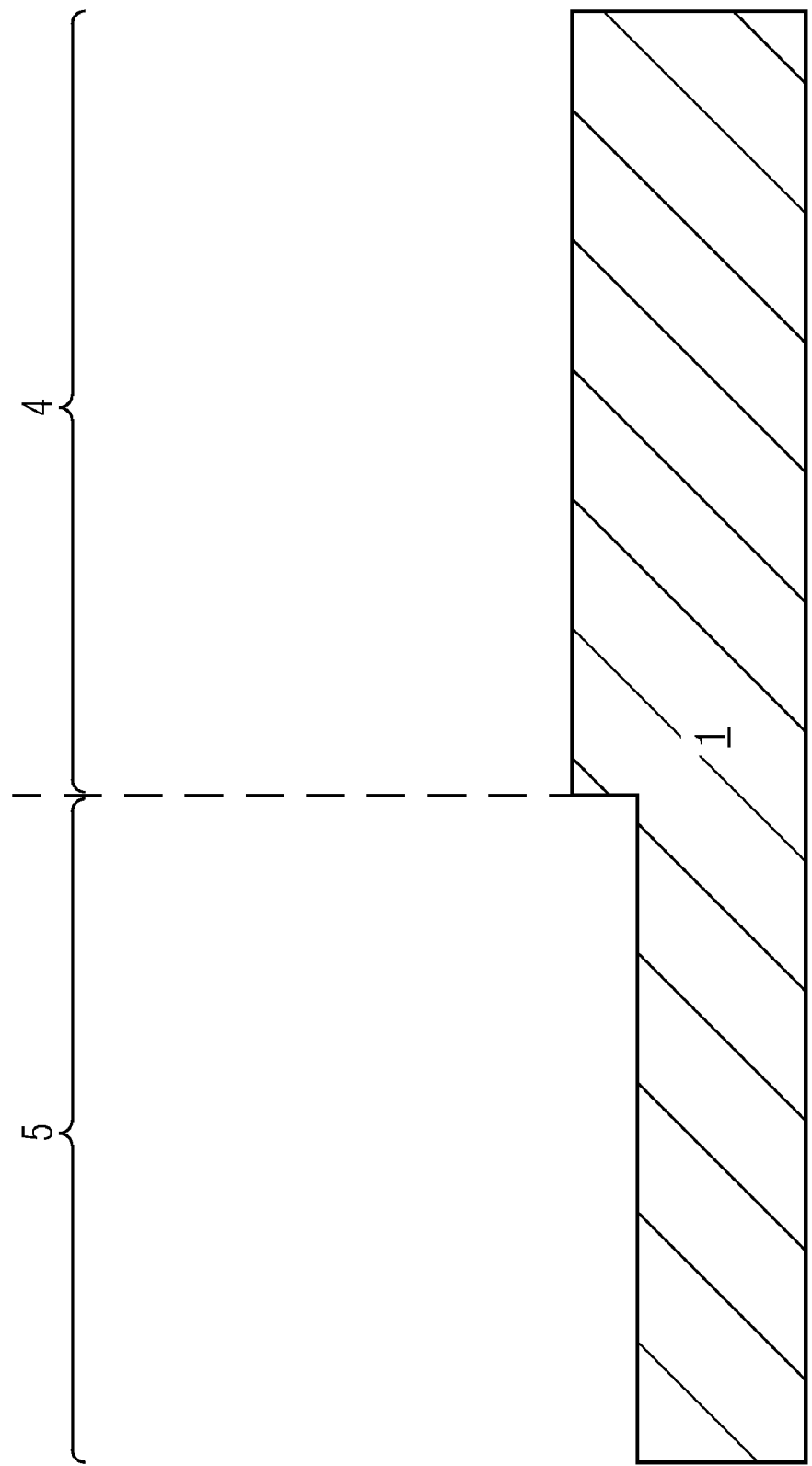

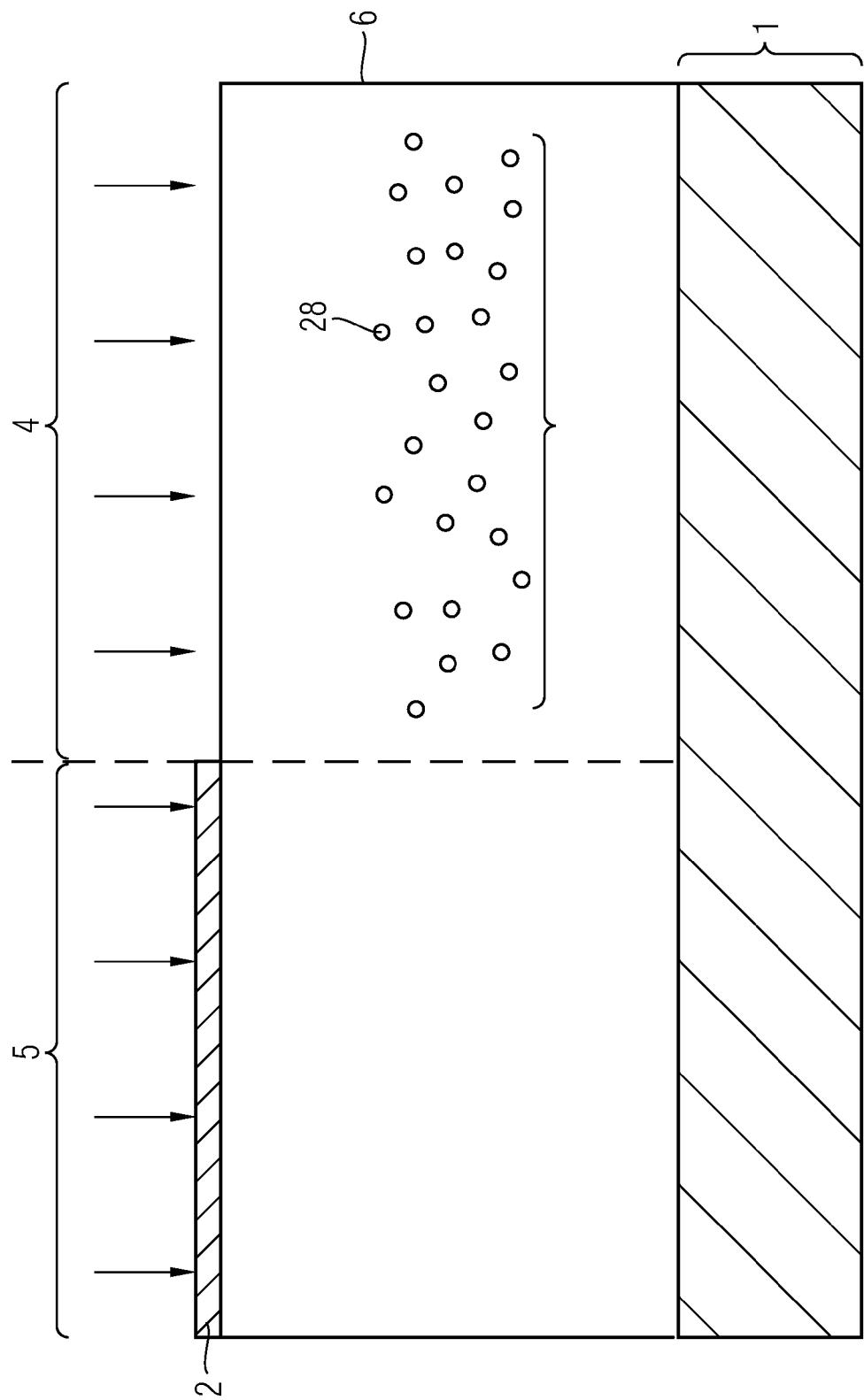

SEMICONDUCTOR COMPONENT ARRANGEMENT HAVING A FIRST AND SECOND REGION

CROSS-REFERENCE TO RELATED APPLICATIONS

This Utility Patent Application claims priority to German Patent Application No. DE 10 2005 049 593.1 filed on Oct. 17, 2005, which is incorporated herein by reference.

BACKGROUND

The invention relates to a semiconductor component arrangement and a method for fabricating it.

Semiconductor technologies for applications in automotive, consumer or industrial electronics are distinguished by a multiplicity of different types of semiconductor components such as, for example, DMOS-FET (Double Diffused Metal Oxide Semiconductor-Field Effect Transistor) power transistors, MOSFETs, bipolar transistors and also resistors and capacitors. In this case, the components are arranged on a chip usually in regions which are based on a specific functionality. Thus, for instance, a first region may have a DMOS power transistor having a low on resistivity as a low-side switch, high-side switch or in a bridge configuration. A further region may be formed for instance with CMOS logic components for providing flip-flops, digital gates, etc. A further region may likewise be formed with analog components for instance for providing temperature sensors or bandgaps.

Technologies for providing such a multiplicity of semiconductor components are known as BCD (Bipolar CMOS DMOS), SPT (Smart Power Technology) or else SMART technology. Since the semiconductor components of all the regions are formed in a common semiconductor layer, for instance an epitaxial layer, lithographically fabricated semiconductor zones serving for forming semiconductor components are utilized for components of different regions for cost reasons, so that a simultaneous optimization of the semiconductor components in the different regions is required. Such an optimization with regard to the electrical properties at the semiconductor components in the different regions often leads to problems and compromise solutions in practice. However, by way of example, in the case of a CMOS-DMOS technology with a DMOS embodied as a field plate trench transistor, the analog components are realized within voltage-stable semiconductor zones of the p conductivity type. In addition, there are insulated p-channel MOSFETs and vertical bipolar components which are in each case formed in a deeply implanted semiconductor zone of the p conductivity type. In the case of this technology, the thickness of the epitaxial layer is determined by the electrical properties of the analog components and the DMOS transistor, on account of the field plate trench arrangement, has an on average significantly higher breakdown voltage than the semiconductor wells of the p conductivity type for the analog components. It would be desirable for robustness reasons, however, to form the DMOS power transistor with a lower breakdown voltage in comparison with the analog wells of the p conductivity type, so that it can protect them from electrical overloading such as e.g., due to ESD (Electrostatic Discharge) or EOS (Electrical Overstress) and has an optimized on resistance Ron. The same applies in lessened form to a semiconductor technology with DMOS formed in planar fashion.

For these and other reasons, there is a need for the present invention.

SUMMARY

One embodiment provides a semiconductor component arrangement having a power transistor formed within a semiconductor layer in at least one first region and further semiconductor components formed at least in a second region. An effective thickness of the semiconductor layer is smaller in the first region than in the second region.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1A-E illustrate schematic cross-sectional views concerning processes for fabricating a semiconductor component arrangement having two regions having different effective thicknesses in accordance with a first embodiment of the invention.

FIGS. 2A-2C illustrate schematic cross-sectional views concerning processes for fabricating a second embodiment of a semiconductor component arrangement.

FIGS. 3A-3C illustrate schematic cross-sectional views concerning processes for fabricating a third embodiment of a semiconductor component arrangement.

DETAILED DESCRIPTION

Figure 1A:
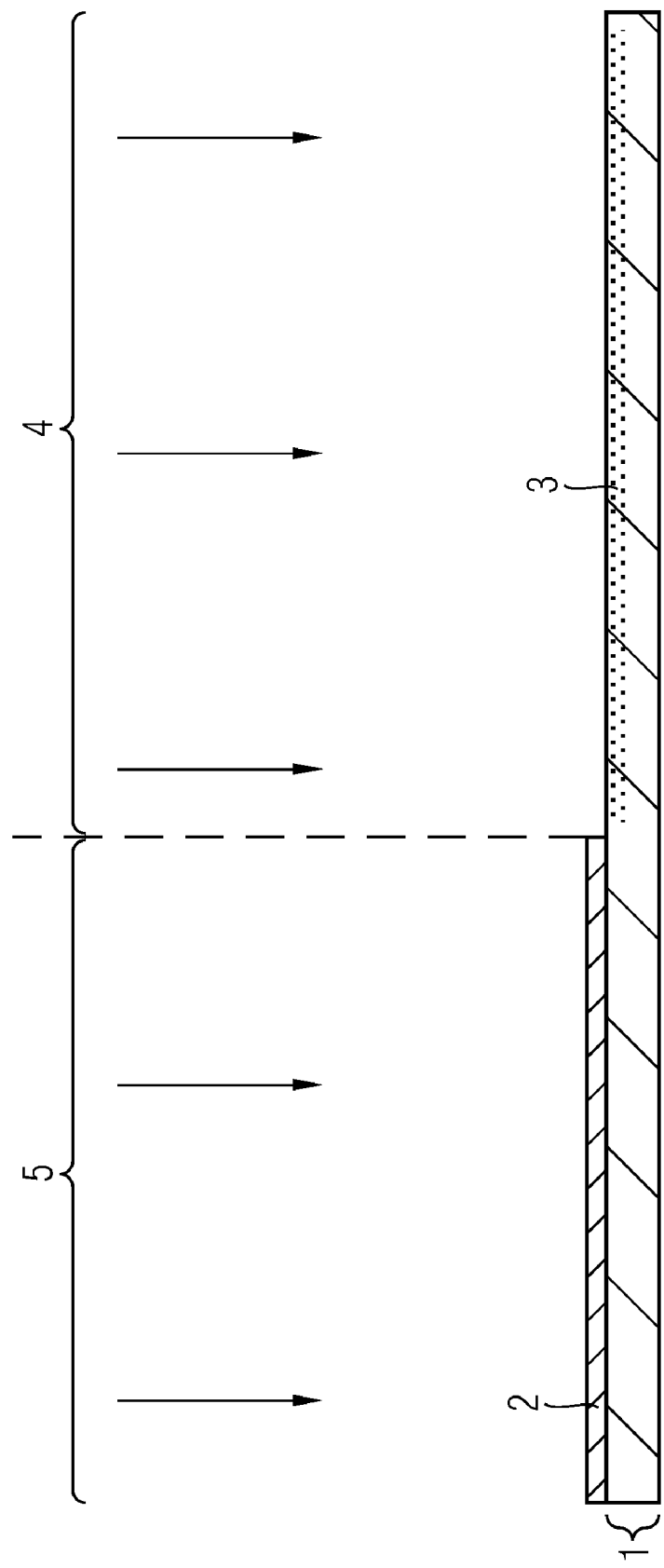

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the invention provides a semiconductor component arrangement and a method for fabricating it such that a simultaneous optimization of semiconductor components in different functional regions is possible.

According to one embodiment of the invention, the semiconductor component arrangement has a semiconductor layer formed on a semiconductor substrate, and also an insulation and wiring region formed above the semiconductor layer, the semiconductor layer having specific dopants of a first conductivity type in a specific concentration. The semiconductor component arrangement likewise has further semiconductor zones, formed within the semiconductor layer and having further dopants, the further semiconductor zones forming a power transistor in a first region of the semiconductor layer and further semiconductor components in a second region of the semiconductor layer. A semiconductor structure having only the specific dopants in the specific concentration, within the semiconductor layer, adjoins a further semiconductor structure at the underside of the semiconductor layer. The further semiconductor structure, below the first and second regions of the semiconductor layer has the first conductivity type and has a higher concentration of dopants in comparison with the specific concentration, a distance between the underside of the semiconductor structure and a horizontal reference level within the insulation and wiring region being smaller in the first region of the semiconductor layer than in the second region of the semiconductor layer.

A semiconductor structure having only the specific dopants in the specific dopant concentration in the above connection may have further dopants in a concentration less than the specific concentration. The semiconductor substrate is preferably formed as a wafer, in particular as a silicon wafer or as a wafer of a further semiconductor material such as germanium, silicon-germanium or III-V compound semiconductors such as gallium arsenide. The insulation and wiring region preferably has one or a plurality of metal layers that run one above another and make contact with the semiconductor components in the semiconductor layer via filled contact holes in the insulation and wiring region. The metal layer or the plurality of metal layers serve(s) for conductive connecting between the semiconductor components and thus for realizing a circuit arrangement. The power transistor formed in the first region performs for example the switching function in a low-side or high-side switch and preferably has a lowest possible on resistivity. The second region has for example an analog and digital circuit block, the further semiconductor components on which these blocks are based having, in particular, bipolar transistors, n-channel and p-channel MOSFETs for CMOS circuits, diodes, resistors and capacitors. It should be taken into consideration that the second region may likewise have a semiconductor component corresponding to the semiconductor component type of the power transistor, e.g., a DMOS transistor. In this case, the DMOS transistor is not formed as a power transistor and is thus significantly smaller than the power transistor formed in the first region.

In one embodiment, the semiconductor components are formed with the aid of the further semiconductor zones, which may be both of the first and of the second conductivity type. The further semiconductor zones may be formed for example by implantation of the corresponding dopants and a subsequent activation and annealing. The implantation may be effected for example into the semiconductor substrate before producing the semiconductor layer for forming buried semiconductor zones or buried layers, or alternatively after producing the semiconductor layer for forming source/drain zones, body zones, emitter, base or else collector zones. The semiconductor layer, the dopant composition of which is not changed beyond the specific dopant concentration by the further semiconductor zones, is designated as the semiconductor structure. If, by way of example, a highly doped buried layer is present toward the semiconductor substrate, a part of which buried layer reaches into the semiconductor layer, then this part of the semiconductor layer is not a constituent part of the semiconductor structure. However, this part of the semiconductor layer contributes to the further semiconductor structure that lies below the semiconductor structure and adjoins the latter. In regions in which no buried layer is formed, the corresponding part of the further semiconductor structure is formed by the semiconductor substrate. Consequently, semiconductor structure and further semiconductor structure serve for local demarcation of the semiconductor layer that is unchanged, e.g., is not doped more highly beyond the specific dopant concentration and has the specific dopants, downwardly, for instance for demarcation between an n/n+ or p/p+ junction.

The first conductivity type may be the p type and the second conductivity type may be the n type. Likewise, the first conductivity type may be the n type and the second conductivity type may be the p type.

In one embodiment, a difference between the distances in the first and second regions lies within the range of 0.5 μm to 5 μm. By increasing the distance, it is possible to lower a breakdown voltage of the power transistor relative to breakdown voltages in the second region, for instance electrical breakdowns of well zones with respect to the semiconductor substrate.

In a further embodiment, the semiconductor layer and the semiconductor substrate are of the same conductivity type. The semiconductor structure in the first region adjoins a first part of the further semiconductor structure, which first part has one of the further semiconductor zones, which is of the same conductivity type as the semiconductor layer and has a higher concentration of dopants in comparison with the specific concentrations, and the semiconductor structure in the second region adjoins a second part of the further semiconductor structure, which second part corresponds to the semiconductor substrate. Consequently, the one of the further zones is formed as a buried layer and the latter forms the first part of a further semiconductor structure. No buried layer is present in the second region, that is to say that the semiconductor layer directly adjoins the semiconductor substrate. Consequently, the semiconductor structure in the second region corresponds to the semiconductor layer and the further semiconductor structure corresponds to the semiconductor substrate. A semiconductor component arrangement of this type is appropriate particularly in SMART technology.

In a further embodiment, the semiconductor substrate has arsenic as dopant and the one of the further semiconductor zones has phosphorus as dopant. Since posphorus diffuses in silicon to a greater extent than arsenic, the one of the further semiconductor zones can be fabricated from the semiconductor substrate after implantation of corresponding dopants and it is possible to specify a difference in the distances between the semiconductor structure and the reference level between first and second regions.

In a further embodiment, the semiconductor layer and the semiconductor substrate are of opposite conductivity types, the semiconductor structure in the first region adjoins a first part of the further semiconductor structure, which first part has a first one of the further semiconductor zones, which is of the same conductivity type as the semiconductor layer and has a higher concentration of dopants of the first dopant element in comparison with the specific concentration, and the semiconductor structure in the second region adjoins a second part of the further semiconductor structure, which second part has a second one of the further semiconductor zones, which is of the same conductivity type as the semiconductor layer and has a higher concentration of dopants of a second dopant element, which is different from the first dopant element, in comparison with the specific concentration.

As a result of this, buried layers are formed both in the first region and in the second region, but the buried layers differ with regard to the dopant element. By a suitable choice of the dopant elements, different distances between the semiconductor structure and the reference level can be achieved by means of the different outdiffusion of the dopant elements after the implantation thereof into the semiconductor substrate. This embodiment is particularly suitable for SPT or BCD technology where the semiconductor substrate is not of the same conductivity type as the semiconductor layer.

In this case, if the first dopant element is phosphorus and the second dopant element is arsenic, since, after implantation of the dopants into the semiconductor substrate, phosphorus diffuses further into the semiconductor layer than arsenic and it is thereby possible to achieve the different distances in the first and second regions.

In a further embodiment, one of the further semiconductor zones of the first conductivity type extends in the first region from an underside of the semiconductor layer as far as a surface of the semiconductor layer with a dopant concentration that decreases from the underside to the surface. In this case, the dopants assigned to the corresponding semiconductor zone diffuse through the entire semiconductor layer after implantation into the semiconductor substrate. This embodiment is of significance particularly when the semiconductor layer has small thicknesses within the range of 0.5 to 5 micrometers.

In a further embodiment, the semiconductor substrate has processes at an interface with the semiconductor layer, the interface being at a greater distance from the reference level in the second region than in the first region. In this embodiment, a difference in the distances between the underside of the semiconductor structure in the first and second regions and the reference level is not achieved by different outdiffusion of different dopants, but rather by means of a process which is formed in the semiconductor substrate and is transferred to a subsequently produced semiconductor layer. A process in the region of a top side of the semiconductor layer may be removed for example by planarization of the top side of the semiconductor layer.

In one embodiment, the power transistor is a DMOS transistor and the further semiconductor components form a CMOS circuit block and/or an analog circuit block. A semiconductor component arrangement of this type can be achieved through the use of BCD, SPT and SMART technologies and is applied diversely in applications appertaining to automotive, consumer and industrial electronics, for example in the form of power switches.

A method according to the invention for fabricating a semiconductor component arrangement according to the invention has the processes of providing the semiconductor substrate, selectively introducing dopants of the conductivity type of the semiconductor substrate into those regions of the semiconductor substrate above which the one of the further semiconductor zones is formed in later processes. The method includes producing the semiconductor layer on the semiconductor substrate, forming the one of the further semiconductor zones by thermally induced diffusion of the dopants that have been selectively introduced into the semiconductor substrate into the one of the further semiconductor zones, and completing the semiconductor component arrangement. The dopants can be introduced selectively into the semiconductor substrate for example by implantation or diffusion for instance from a solid source (e.g., posphorus-doped glass for the introduction of posphorus). A lithographic patterning of e.g., a solid source or an implantation mask serves for selectively introducing the dopants. The semiconductor layer is preferably applied as an epitaxial layer and has specific dopants of a first conductivity type in a specific concentration. The dopants correspond e.g., to boron if the first conductivity type is a p-type. If the first conductivity type is an n-type, the specific dopants correspond e.g., to posphorus. Alongside boron and posphorus, however, a multiplicity of further dopants are suitable for achieving an n- or p-type conductivity. The dopant concentration in the semiconductor layer is preferably homogeneous, but it may also increase or decrease gradually toward the surface. The diffusion of the dopants that have been selectively introduced into the semiconductor substrate into the one of the further semiconductor zones, that is to say the outdiffusion of the buried layer, may be effected by means of a high-temperature process specially provided for this purpose, or alternatively by means of high-temperature processes inherently present in the process, for instance during the production of the semiconductor layer. The completion of the semiconductor component arrangement includes for example the formation of the further semiconductor zones, e.g., the source/drain zones, emitter, base and collector zones, body zones, etc. and the formation of the insulation and wiring region.

A further embodiment of a method for fabricating a semiconductor component arrangement according to the invention involves performing the processes of providing the semiconductor substrate, selectively introducing the dopants of the first dopant element into those regions of the semiconductor substrate above which the first part of the further semiconductor structure is formed in later processes, selectively introducing the dopants of the second dopant element into those regions of the semiconductor substrate above which the second part of the further semiconductor structure is formed in later processes, producing the semiconductor layer on the semiconductor substrate, thermally induced diffusion of the dopants of the first and second dopant elements from the semiconductor substrate into overlying regions of the first and second further semiconductor zones, and completing the semiconductor component arrangement. In contrast to the method explained above, this embodiment serves for forming a respective buried layer in the first and second regions, it being the case that the two buried layers differ from one another, however, by virtue of the dopant element and thus, on account of different outdiffusions of the buried layers, also in terms of the vertical extent of the further semiconductor structure into the semiconductor layer. Whereas the embodiment explained above is suitable for SMART technologies, in particular, this embodiment can be integrated into an SPT or BCD process, in particular. For outdiffusion of the dopants from the semiconductor substrate into the semiconductor layer, production of the semiconductor layer and also for completion of the component arrangement by known method processes, reference is made to the explanations regarding the embodiment above.

A further embodiment of a method for fabricating a component arrangement according to the invention has the processes of providing the semiconductor substrate, selectively removing parts of the semiconductor substrate in those surface regions above which the second region of the semiconductor layer is formed in later processes, producing the semiconductor layer on the semiconductor substrate, and completing the semiconductor component arrangement. The selective parts of the semiconductor substrate are preferably removed by etching. In this case, it is possible to cover with an etching mask for example the regions which are different from the later second region, such as the first region at the surface of the semiconductor substrate, after which the semiconductor substrate can be subjected to wet-chemical or else dry-chemical etching in the uncovered second region that has not been covered. By way of example, a mixture of nitric acid, hydrofluoric acid and water is suitable for the wet-chemical etching of a semiconductor substrate composed of silicon, it being possible for the dry-chemical etching to be performed as a plasma process using e.g., fluorine- or chlorine-containing etching gas. For production of the semiconductor layer and for completion of the component arrangement, reference is made to the explanations concerning the embodiment of both. A process in the region of a topside of the semiconductor layer may be removed for example by planarization of the top side of the semiconductor layer.

A further embodiment of a method for fabricating a semiconductor component arrangement according to the invention involves performing the processes of providing the semiconductor substrate, producing the semiconductor layer on the semiconductor substrate, selectively introducing elements corresponding to the elements of the semiconductor layer into the semiconductor layer in the first region and performing a thermal process for diffusion of dopants from the semiconductor substrate into the semiconductor layer, a further-reaching diffusion of the dopants from the semiconductor substrate into the semiconductor layer being effected in the first region than in the second region on account of the selectively introduced elements, and completing the semiconductor component arrangement. This embodiment provides for a deep implantation of the dopants in high doses in order to enable an intensified diffusion of dopants from the semiconductor substrate into the semiconductor layer formed from silicon by means of interstitials. The interstitials can be produced for example likewise by local oxidation at the surface of the semiconductor layer in the first region. Interstitials are released during the formation of such a LOCOS structure and, for their part, then lead to an intensified outdiffusion of dopants from the semiconductor substrate into the semiconductor layer and thus to a reduction of an effective thickness of the semiconductor layer.

FIG. 1A illustrates a schematic cross-sectional view at the beginning of a sequence of method processes for fabricating a first embodiment of a semiconductor component arrangement in a semiconductor layer having an adapted effective thickness. On an n$^+$-type semiconductor substrate 1 in the form of a silicon wafer that is provided at the outset, an implantation mask 2 is patterned lithographically and n-type dopants 3 e.g., posphorus, are implanted into the semiconductor substrate 1 into a first region 4. In a second region 5, the dopants do not penetrate into the semiconductor substrate, but rather are stopped in the implantation mask 2.

Figure 1B:
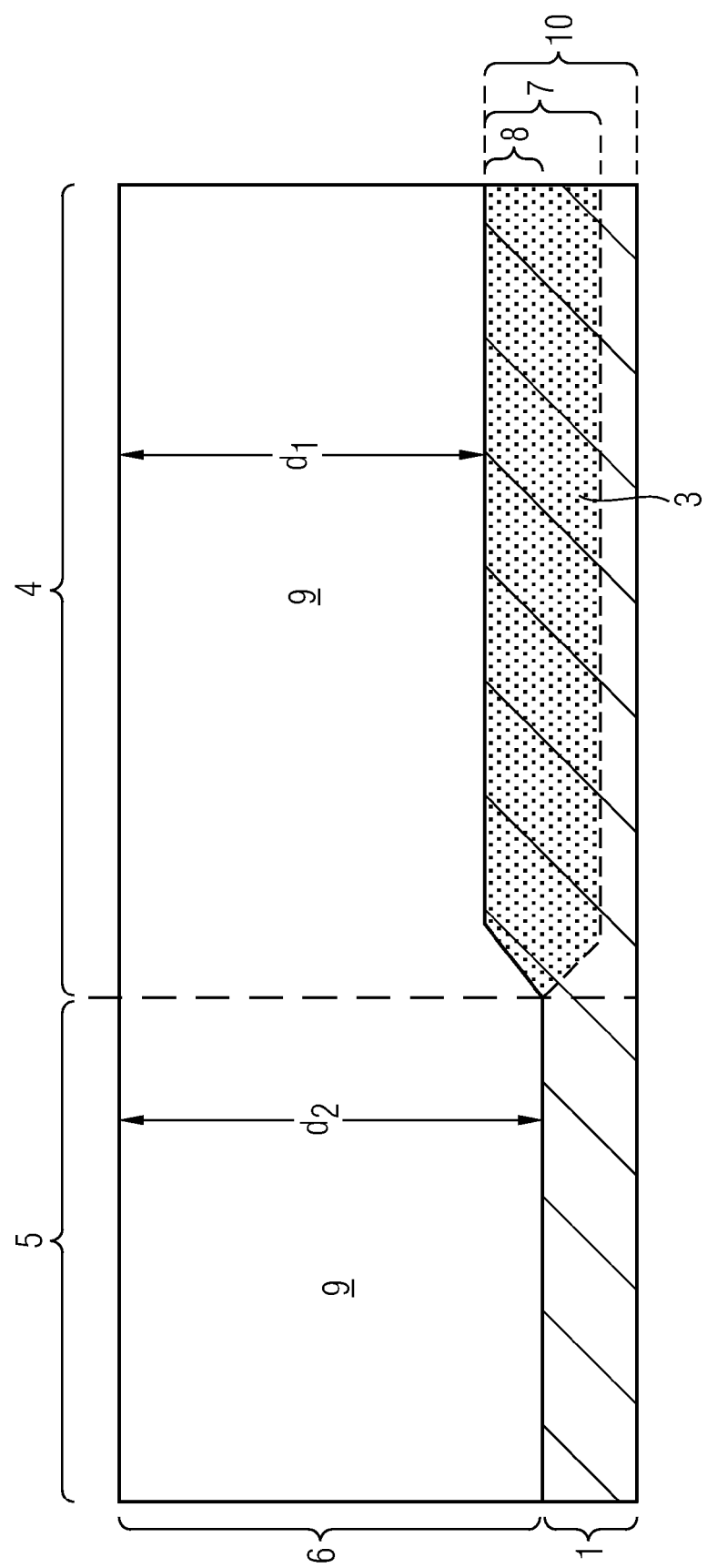

In the schematic cross-sectional view illustrated in FIG. 1B, the implantation mask 2 was removed and an n-type epitaxial layer 2 was applied to the semiconductor substrate 1 with a specific dopant concentration within the range of $10^{16}$ to $10^{27}$ cm$^{-3}$. In the first region 4, the dopants 3 were diffused both into the epitaxial layer 6 and into the semiconductor substrate 1 by means of a thermal step. A buried layer 7 is formed as a result of this, which buried layer defines within the epitaxial layer 6 a further semiconductor zone 8 having a higher dopant concentration in comparison with the epitaxial layer. The regions of the epitaxial layer having the specific dopant concentration which are not doped in intensified fashion by means of the further semiconductor zone 8 and are thus unchanged form a semiconductor structure 9. A further semiconductor structure 10 formed from buried layer 7 and semiconductor substrate 1 lies below the semiconductor structure 9 and in a manner adjoining the latter. An effective thickness $d_1$ of the semiconductor structure 9 in the first region 4 is smaller than the effective thickness $d_2$ of the semiconductor structure 9 in the second region 5, so that a lower voltage can be built up in the first region 4 across the semiconductor structure 9 in comparison with the second region 5, that is to say that breakdown voltages of components formed in the first region 4 assume comparatively lower values when voltage is built up across the semiconductor structure 9 and an on resistance of a power transistor formed therein can be optimized.

In the schematic cross-sectional view in FIG. 1C, trenches 11 are etched into the epitaxial layer 6 into the first region 4 forming a power transistor, which trenches are entirely or partly covered with a field oxide 12 on side walls.

Figure 1D:
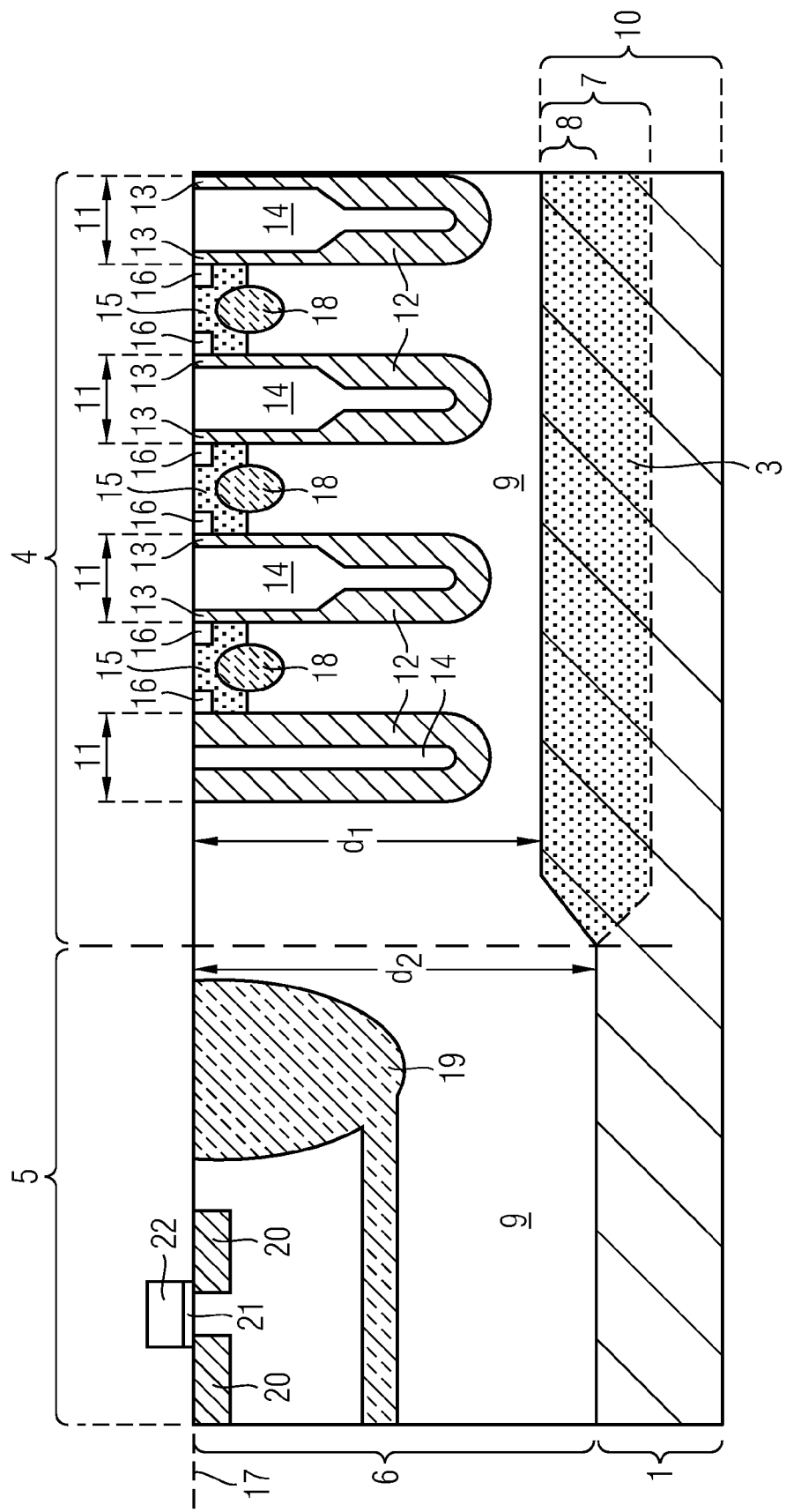

The schematic cross-sectional view in FIG. 1D illustrates further semiconductor zones for forming the power transistor in the first region 4 and a p-channel MOSFET in the second region 5 serving as an analog part. The trenches 11 are thus formed in the upper region with a gate oxide structure 13 adjoining the semiconductor structure 9. It should be taken into consideration that the gate oxide structure 13 merges into the field oxide 12 in the lower region of the trenches 11. The trench 11 formed furthest on the left, in which no gate oxide is formed, likewise serves for the edge termination of the power transistor. The trenches 11 are filled with an electrode structure 14. The electrode structure 14 serves as a field electrode in the lower region of the trenches and as a gate electrode for controlling a channel conductivity of the power transistor in the upper part of the trenches. In order to complete the power transistor, body zones 15 are additionally formed in a mesa zone between adjacent trenches 11. Within the body zone 15, source zones 16 are likewise provided in a manner adjoining the gate oxide structure 13, the source zones reaching as far as a surface 17 of the epitaxial layer 6. Additional semiconductor zones 18 of the conductivity type of the body zone are formed below the body zone 15 and in a manner overlapping the latter. It should be taken into consideration that the conductivity of the body zones 15 and that of the additional semiconductor zones 18 are of opposite conductivity types in comparison with the source zones 16 and the epitaxial layer 2. In the second region 5 serving as an analog part, a well insulation structure 19 is formed as a further semiconductor zone in the epitaxial layer 6. The well insulation structure 19 insulates a zone with semiconductor components that is integrated therein from an outer part of the epitaxial layer 6 or the semiconductor substrate 1. Such an insulation technique is also referred to as junction isolation. Consequently, the conductivity of the well insulation structure 19 is of the opposite conductivity type compared with the semiconductor layer 6. Source/drain zones 20 adjoining the surface 17 are formed within the well insulation structure 19. Lying between the zones, above and adjoining the surface 17, is a further gate oxide structure 21, above which a further gate electrode structure 22 is formed. The further gate electrode structure 22 serves for controlling the channel conductivity of a MOSFET formed within the well insulation structure 19.

Figure 1E:
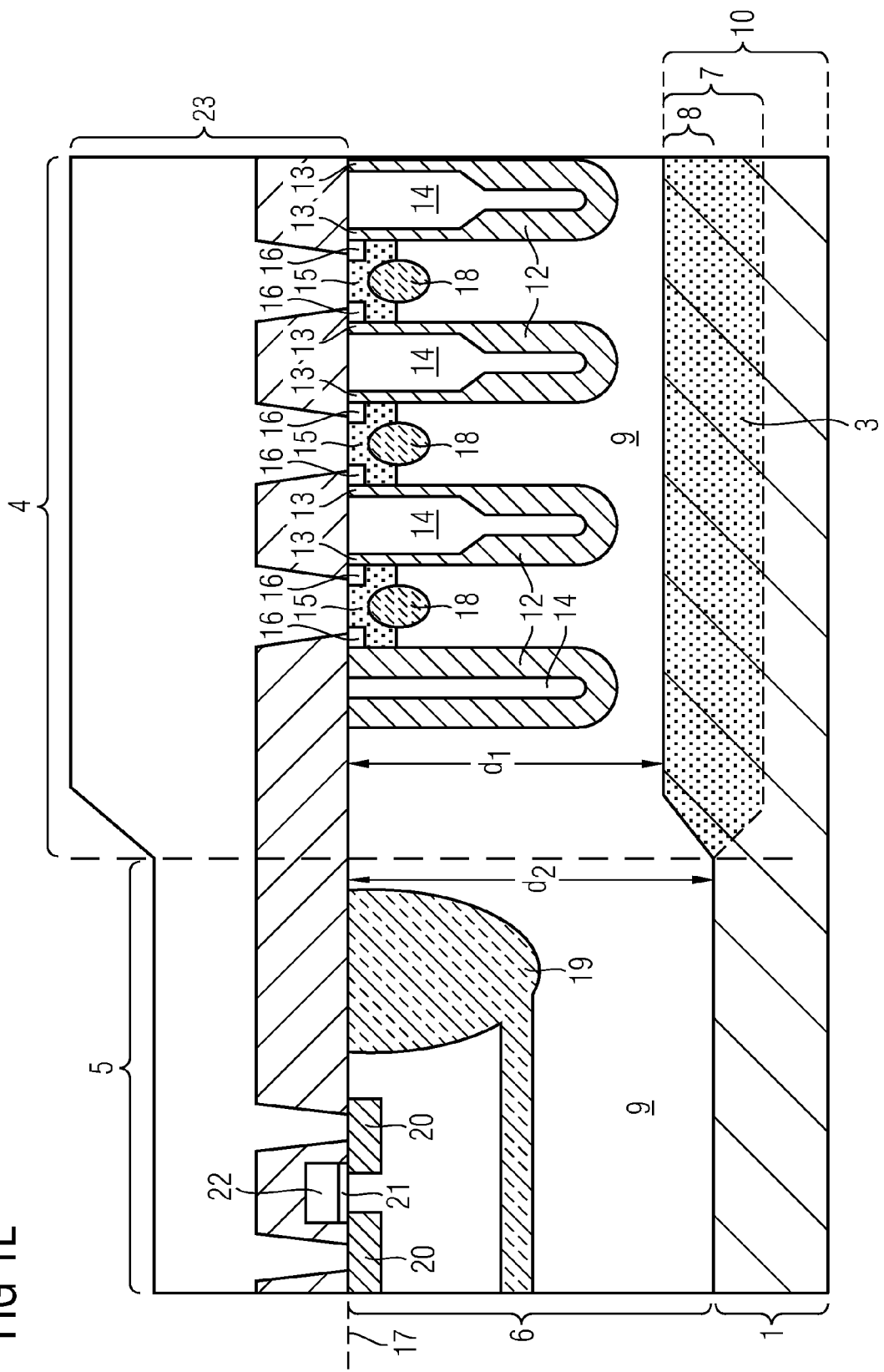

FIG. 1E illustrates a cross-sectional view of the first region 4 and of the second region 5 after the formation of the semiconductor components and the wiring thereof by means of a wiring and insulation region 23. On account of the smaller effective thickness $d_1$ in the first region 4 in comparison with the effective thickness $d_2$ in the second region 5, a breakdown voltage of the power transistor in the first region is optimized with regard to the breakdown voltages of the semiconductor components in the second region. An optimization of the on resistance Ron is simultaneously achieved besides the optimization of the breakdown voltage, since a smaller effective thickness entails a lower on resistance. The optimization of the effective thickness $d_1$ makes it possible to increase the robustness, since the breakdown voltage of the power transistor can be lowered in comparison with the breakdown voltage of the semiconductor components in the analog part (second region 5). Consequently, the power transistor can perform a protective function for the semiconductor components in the analog part, with simultaneous optimization of the on resistance Ron.

FIG. 2A illustrates a schematic cross-sectional view at the beginning of a sequence of method processes for fabricating a second embodiment of a semiconductor component arrangement in a semiconductor layer with an adapted effective thickness. As illustrated in FIG. 1A in the case of the previous embodiment, on a $p^-$-type semiconductor substrate 1 in the form of a silicon wafer that is provided at the outset, an implantation mask 2 is patterned lithographically and phosphorus is implanted as first n-type dopants 24 into the semiconductor substrate 1 into the first region 4. In a second region 5, the dopants do not penetrate into the semiconductor substrate, but rather are stopped in the implantation mask 2.

Figure 2B:
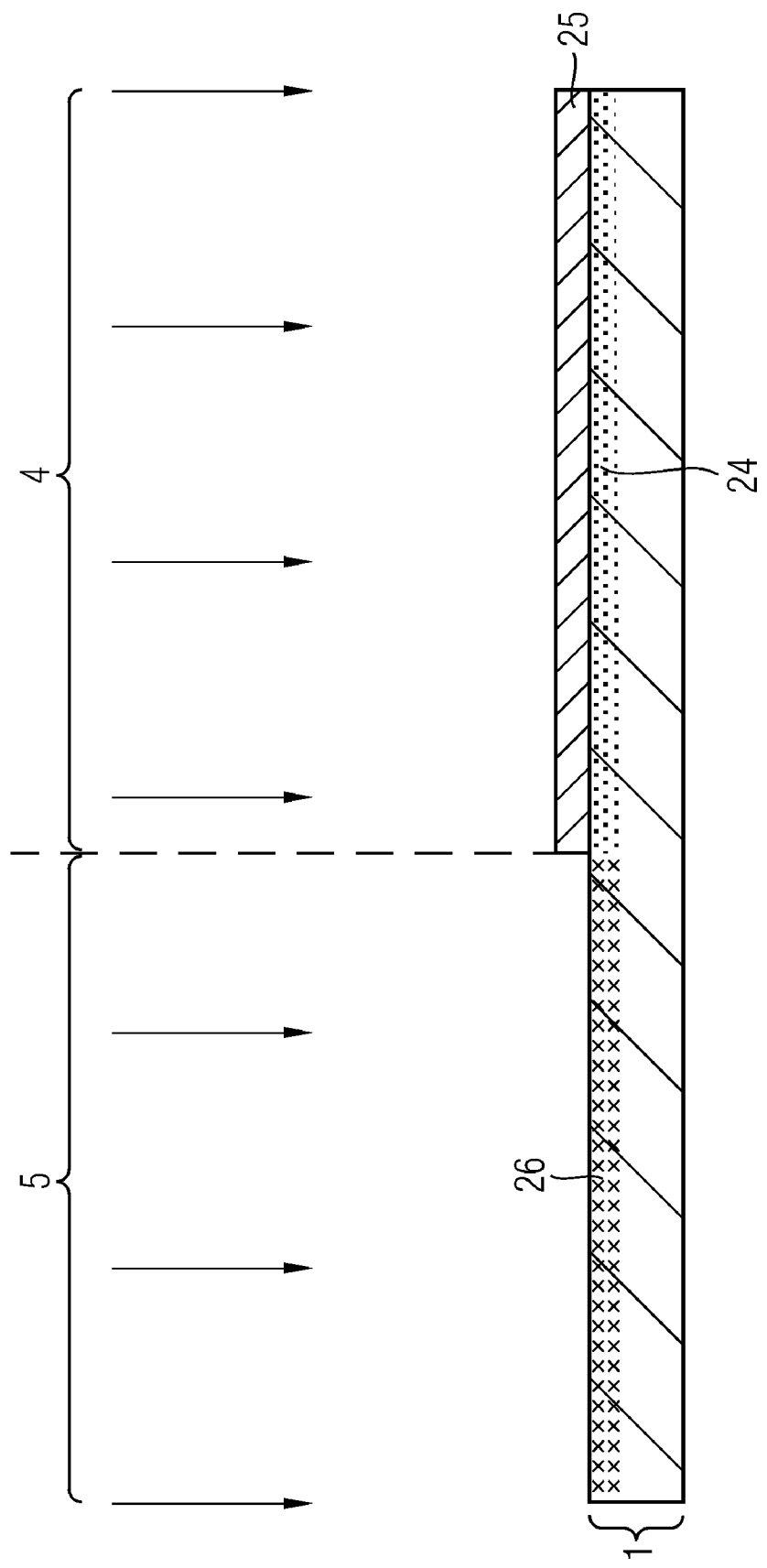

After the implantation mask 2 has been removed again, as illustrated in FIG. 2B, a further implantation mask 25 is patterned lithographically on the semiconductor substrate 1, so that it now covers the first region 4 and leaves the second region 5 open. In the case of implantation with arsenic, second dopants 26 penetrate into the semiconductor substrate 1 in the second region 5, but are stopped within the further implantation mask 25 in the first region 4.

Figure 2C:
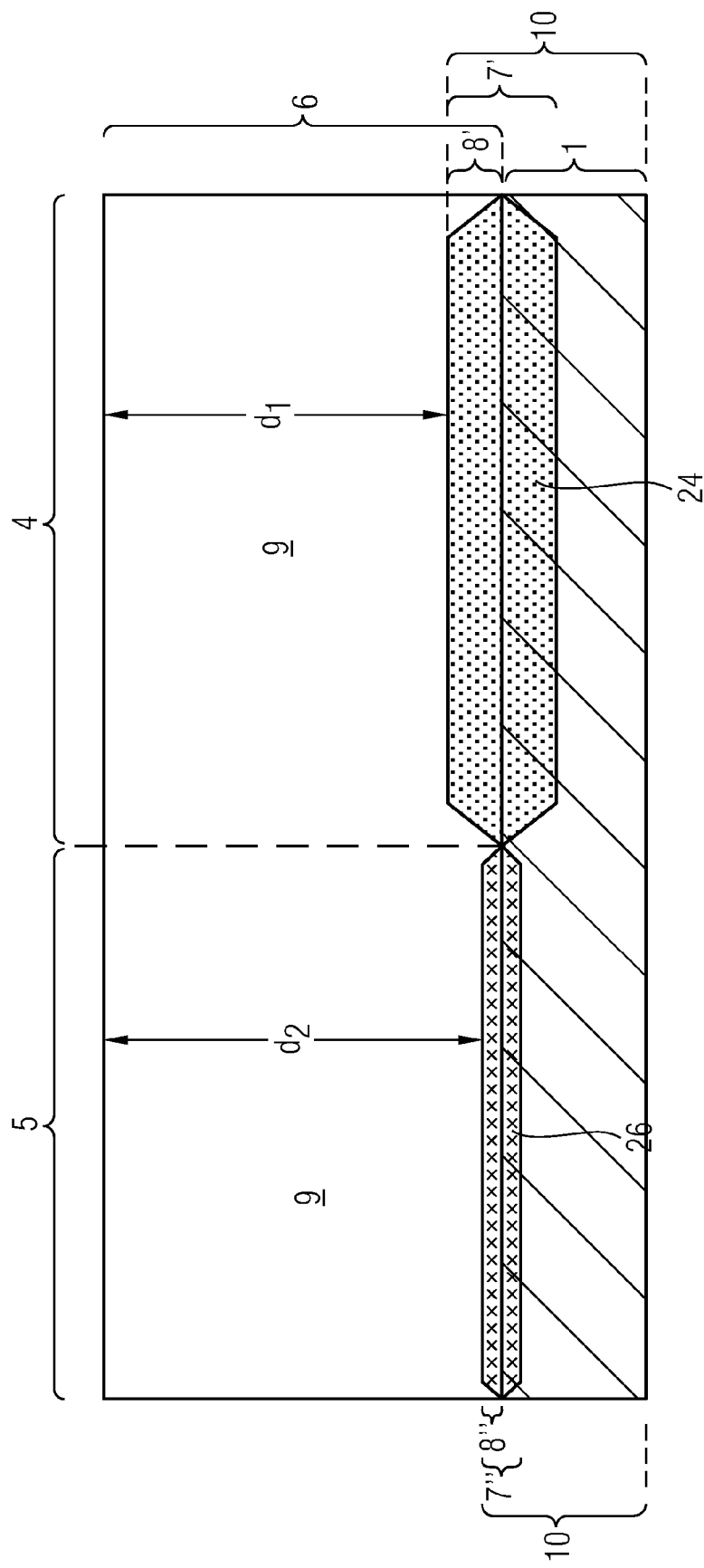

In the subsequent method process illustrated in FIG. 2C, the epitaxial layer 6 is applied to the semiconductor substrate 1. During this high-temperature step, crystal defects caused by the implantation are annealed, the dopants 24, 26 are activated and the latter diffuse into the epitaxial layer 6. Depending on the fabrication temperature of the epitaxial layer 6, further high-temperature processes may also be used for this purpose. Since the first dopants 24 diffuse into the epitaxial layer 6 further than the second dopants 26, different effective layer thicknesses are obtained between first region ($d_1$) and second region ($d_2$), as is also possible with the previous embodiment in FIG. 1B. This embodiment is suitable in particular for SPT or BDC technologies where the semiconductor substrate 1 and the epitaxial layer 6 are of different conductivity types. In this case, buried layers 7', 7" are formed in the first and second regions 4, 5, the buried layers differing from one another by virtue of the dopants. Consequently, in contrast to the previous embodiment, the further semiconductor structure 10 also has a buried layer 7" in the second region 5 in a manner adjoining the semiconductor structure 9. This embodiment can likewise be realized in SMART technology where the conductivity types of epitaxial layer 6 and semiconductor substrate 1 match one another. The method processes of the further embodiment described here are followed by further known method processes for forming semiconductor components in the semiconductor structure 10, as has been illustrated and described for example by FIGS. 1C-1E of the previous, first embodiment. Such known method processes will not be described again below.

FIG. 3A illustrates a schematic cross-sectional view at the beginning of a sequence of method processes for fabricating a third embodiment of a semiconductor component arrangement in a semiconductor layer with an adapted effective thickness. As illustrated in FIG. 2A in the case of the previous embodiment, on a semiconductor substrate 1 in the form of a silicon wafer that is provided at the outset, an etching protective mask 27 is patterned lithographically, so that the semiconductor substrate 1 is covered in the first region 4 and is uncovered in the second region 5. A part of the semiconductor substrate 1 in the second region 5 is then removed by means of an etch, after which a process remains between first and second region in the semiconductor substrate 1, as is illustrated in FIG. 3B.

Figure 3C:
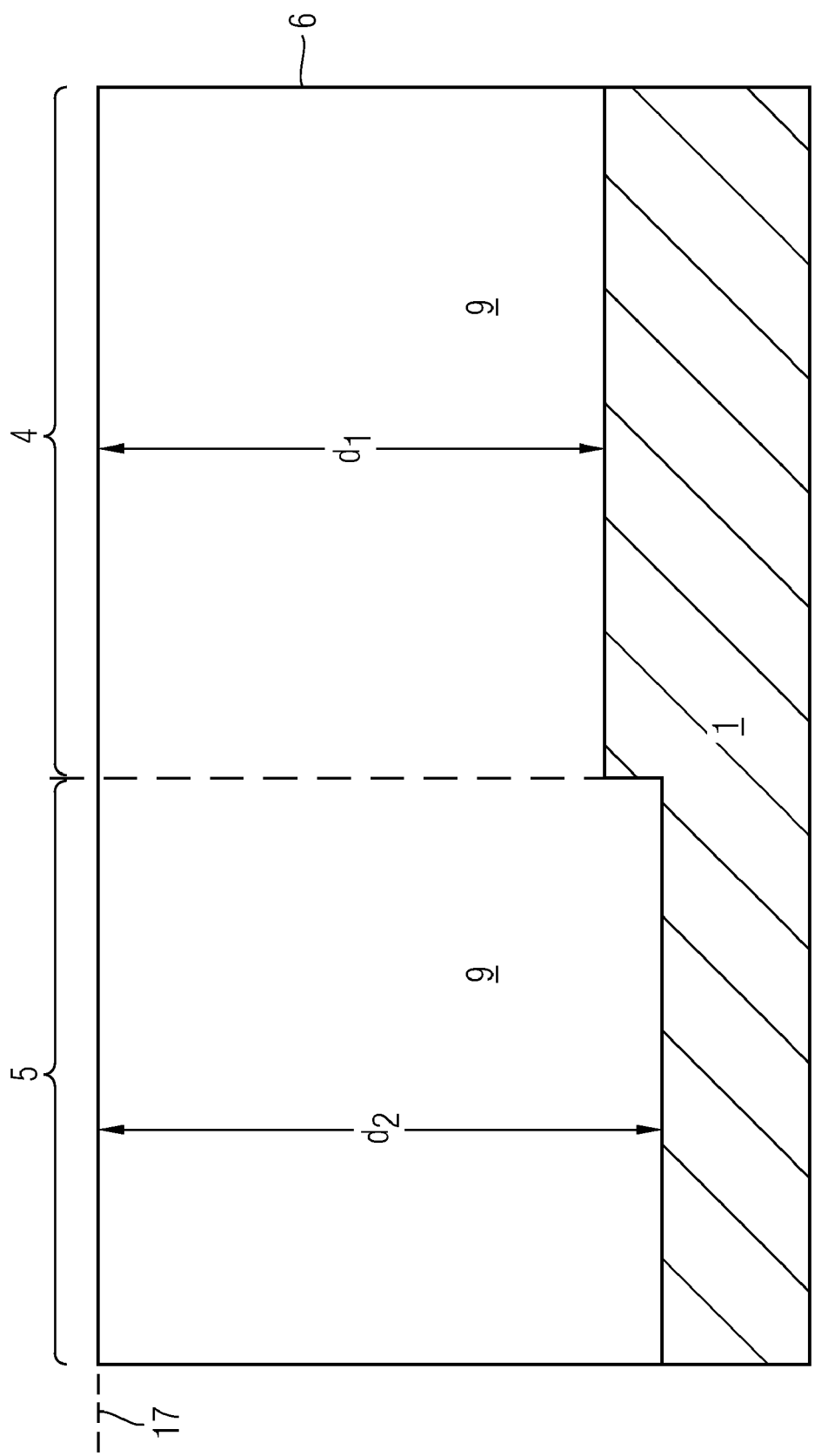

In FIG. 3C, subsequent to the method state illustrated in FIG. 3B, the epitaxial layer 6 was applied to the semiconductor substrate 1 and the surface 17 was planarized, so that the process in the semiconductor substrate 1 is not transferred lastingly to the surface 17. Consequently, through local etching back of the semiconductor substrate 1, this embodiment can specify a difference in the layer thicknesses $d_1$ and $d_2$ between the first region 4 and the second region 5 within the semiconductor structure 9.

FIG. 4A illustrates a schematic cross-sectional view at the beginning of a sequence of method processes for fabricating a fourth embodiment of a semiconductor component arrangement in a semiconductor layer with an adapted effective thickness. After the epitaxial layer 6 made of silicon has been applied to the semiconductor substrate 1, the implantation mask 2 on the epitaxial layer 6 is patterned lithographically in such a way that it covers the second region 5 and leaves the first region 4 free. Silicon atoms 28 are then implanted into the epitaxial layer, the Si atoms penetrating into a first region 4, but being stopped within the implantation mask 2 in the second region 5. The implanted silicon atoms 28 form interstitials in the crystal lattice of the epitaxial layer 6 in the first region 4.

Figure 4B:
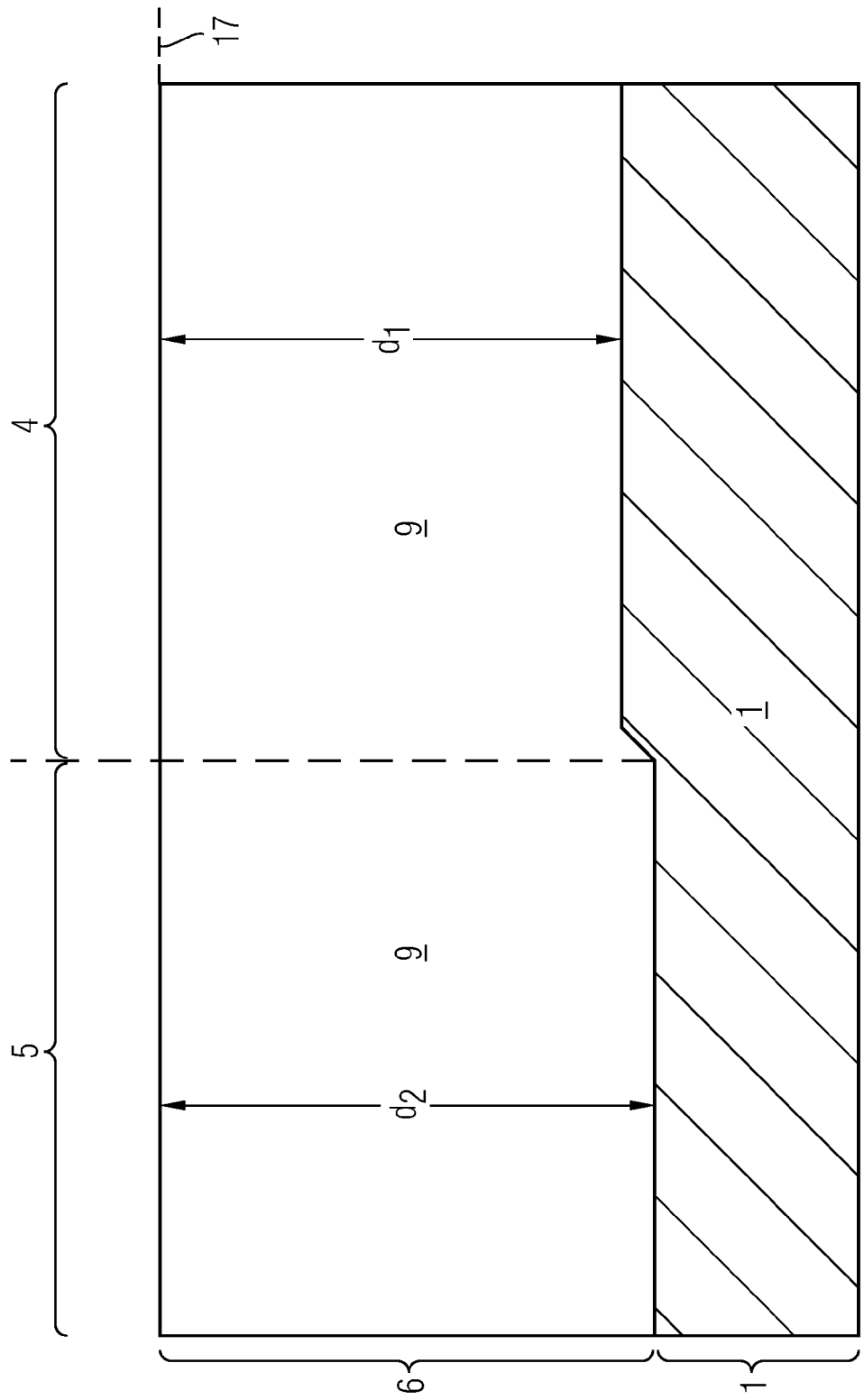
FIGS. 4A and B illustrate schematic cross-sectional views concerning processes for fabricating a fourth embodiment of a semiconductor component arrangement.

FIG. 4B illustrates a schematic cross-sectional view of the fourth embodiment after the implantation mask has been removed, on the one hand, and a high-temperature process has been performed, on the other hand. The high-temperature process leads to the diffusion of dopants from the semiconductor substrate 1 into the epitaxial layer 6. However, the interstitials cause an intensified diffusion of dopants from the semiconductor substrate 1 into the epitaxial layer 6 in the first region 4, so that this results in a smaller effective thickness $d_1$ in the first region 4 compared with the effective thickness $d_2$ in the second region 5.

Such an intensified diffusion of dopants from the semiconductor substrate 1 in the first region 4 and thus a corresponding effective thickness regulation can likewise be achieved by forming a LOCOS structure instead of the implantation of the silicon atoms 28 into the epitaxial layer 6 in the first region 4 at the surface 17 in the first region 4. During this LOCOS process, silicon interstitials are likewise produced in the first region 4 through oxidation of the silicon of the epitaxial layer 6 at the surface 17, the silicon interstitials passing with a typical range in the region of approximately 10 µm during the LOCOS process depending on a layer thickness of the epitaxial layer 6 to the semiconductor substrate 1, where they lead to the intensified diffusion of dopants from the semiconductor substrate 1 into the epitaxial layer 6. By removing the LOCOS structure, a process can additionally be introduced into the epitaxial layer at the surface, as a result of which a reduction of the effective thickness $d_1$ can be intensified. Besides a LOCOS process, a process of this type can also be achieved by etching a part of the epitaxial layer from the surface 17.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component arrangement comprising:
a semiconductor layer formed on a semiconductor substrate, and an insulation and wiring region formed above the semiconductor layer, the semiconductor layer having dopants of a first conductivity type in a first concentration;
further semiconductor zones formed within the semiconductor layer and having further dopants, the further semiconductor zones forming a power transistor in a first region of the semiconductor layer and further semiconductor components in a second region of the semiconductor layer, it being the case that a semiconductor structure having only the dopants in the first concentration, within the semiconductor layer, adjoins a further semiconductor structure at the underside of the semiconductor layer, which further semiconductor structure, below the first and second regions of the semiconductor layer has the first conductivity type and has a higher concentration of dopants in comparison with the first concentration, wherein
the further semiconductor structure comprises a first buried layer formed in the first region and a second buried layer formed in the second region, the layer thickness of the second buried layer being smaller than the thickness of the first buried layer, and the first buried layer adjoining the second buried layer;
a distance between the underside of the semiconductor structure and a horizontal reference level within the insulation and wiring region is smaller in the first region of the semiconductor layer than in the second region of the semiconductor layer; and
a surface of the semiconductor layer adjoining the insulation and wiring region is flat along the first and second regions, respectively.

2. The semiconductor component arrangement as claimed in claim 1, comprising wherein a difference between the distances in the first and second regions lies within the range of 0.5 µm to 5 µm.

3. The semiconductor component arrangement as claimed in claim 1, comprising:
wherein the semiconductor layer and the semiconductor substrate are of the same conductivity type; and
the semiconductor structure in the first region adjoins a first part of the further semiconductor structure, which first part has one of the further semiconductor zones, which is of the same conductivity type as the semiconductor layer and has a higher concentration of dopants in comparison with the first concentrations; and
the semiconductor structure in the second region adjoins a second part of the further semiconductor structure, which second part corresponds to the semiconductor substrate.

4. The semiconductor component arrangement as claimed in claim 3, comprising wherein the semiconductor substrate has arsenic as dopant and the one of the further semiconductor zones has phosphorus as dopant.

5. The semiconductor circuit arrangement as claimed in claim 1, comprising wherein
the semiconductor layer and the semiconductor substrate are of opposite conductivity types;
the semiconductor structure in the first region adjoins a first part of the further semiconductor structure, which first part has a first one of the further semiconductor zones, which is of the same conductivity type as the semiconductor layer and has a higher concentration of dopants of the first dopant element in comparison with the first concentration; and
the semiconductor structure in the second region adjoins a second part of the further semiconductor structure, which second part has a second one of the further semiconductor zones, which is of the same conductivity type as the semiconductor layer and has a higher concentration of dopants of a second dopant element, which is different from the first dopant element, in comparison with the first concentration.

6. The semiconductor circuit arrangement as claimed in claim 5, comprising wherein the first dopant element is phosphorus and the second dopant element is arsenic.

7. The semiconductor circuit arrangement as claimed in claim 1, comprising wherein one of the further semiconductor zones of the first conductivity type extends in the first region from an underside of the semiconductor layer as far as a surface of the semiconductor layer with a dopant concentration that decreases from the underside to the surface.

8. The semiconductor circuit arrangement as claimed in claim 1, comprising wherein the semiconductor substrate has processes at an interface with the semiconductor layer, the interface being at a greater distance from the reference level in the second region than in the first region.

9. The semiconductor component arrangement as claimed in claim 1, wherein the power transistor is a DMOS transistor and the further semiconductor components form a CMOS circuit block and/or an analog circuit block.

* * * * *